United States Patent
Zhang et al.

(10) Patent No.: US 8,766,677 B2
(45) Date of Patent: Jul. 1, 2014

(54) SIGNAL INPUT CIRCUIT/CHIP

(71) Applicant: Maishi Electronic (Shanghai) Ltd., Shanghai (CN)

(72) Inventors: Weihua Zhang, Chengdu (CN); Mei Yu, Chengdu (CN)

(73) Assignee: Maishi Electronic (Shanghai) Ltd., Shanghai (CN)

( * ) Notice: Subject to any disclaimer, the term of this patent is extended or adjusted under 35 U.S.C. 154(b) by 0 days.

(21) Appl. No.: 13/632,439

(22) Filed: Oct. 1, 2012

(65) Prior Publication Data

US 2013/0106489 A1    May 2, 2013

(30) Foreign Application Priority Data

Oct. 26, 2011  (CN) .......................... 2011 1 0335065

(51) Int. Cl.
*H03L 7/00* (2006.01)
(52) U.S. Cl.
USPC .............................. 327/141; 327/142; 327/143
(58) Field of Classification Search
USPC .......................................... 327/141, 142, 143
See application file for complete search history.

(56) References Cited

U.S. PATENT DOCUMENTS

| | | | |
|---|---|---|---|
| 7,075,339 B2 | 7/2006 | Kajimoto | |
| 7,456,657 B2 | 11/2008 | Fukutoyama et al. | |
| 2011/0234267 A1* | 9/2011 | Oda | 327/141 |

FOREIGN PATENT DOCUMENTS

| | | |
|---|---|---|
| CN | 1517883 A | 8/2004 |
| CN | 101047380 A | 10/2007 |
| JP | H04175673 A | 6/1992 |
| JP | 2003087110 A | 3/2003 |
| JP | 2011097271 A | 5/2011 |

OTHER PUBLICATIONS

Japanese Office Action dated Jan. 28, 2014 issued in corresponding Japanese Patent Application No. 2012-235459 (2 pages).

* cited by examiner

*Primary Examiner* — John Poos
(74) *Attorney, Agent, or Firm* — Pillsbury Winthrop Shaw Pittman LLP

(57) ABSTRACT

A signal input circuit and method and chip are disclosed. The signal input circuit includes a control signal input terminal configured for receiving a control signal; at least one common signal input terminal each configured for receiving a corresponding common signal; at least one first signal output terminal each configured for outputting a corresponding first signal; at least one first signal unit each configured for receiving said corresponding common signal and outputting said corresponding common signal as said corresponding first signal under control of said control signal; at least one second signal output terminal each configured for outputting a corresponding second signal; and at least one second signal unit each configured for receiving said corresponding common signal and outputting said corresponding common signal as said corresponding second signal under control of said control signal.

20 Claims, 11 Drawing Sheets

SIGNAL INPUT CIRCUIT/CHIP

RELATED APPLICATIONS

This application claims priority to Patent Application Number 201110335065.8, filed on Oct. 26, 2011 with State Intellectual Property Office of the P.R. China (SIPO), incorporated by reference in its entirety herein.

FIELD OF THE PRESENT TEACHING

The disclosure relates generally to the field of Integrated Circuit (IC) chips, and specifically, the disclosure relates to a method and circuit for inputting signals and a chip with signal input circuit.

BACKGROUND

In an integrated circuit (IC) chip (hereinafter chip), various signals, such as power supply signals, work mode signals and functional signals, etc., are input to a signal input circuit integrated into the chip through pins of the chip, and transmitted to corresponding signal processing units through the signal input circuit. When the chip performs multiple work modes, multiple work mode signals are needed, and the chip performs various work modes by combining these multiple work mode signals.

In a conventional chip, each work mode signal is input through a separate work mode pin, that is, each work mode signal needs a pin. FIG. 1 shows a block diagram of a conventional signal input circuit. As shown in FIG. 1, the signal input circuit 100 includes multiple work mode signal units 111 through 111J and multiple functional signal units 121 through 121K, where J and K represent positive integers. In other words, the signal input circuit 100 includes at least one work mode signal unit and at least one functional signal unit. Each input terminal of the work mode signal units 111 through 11J is used as a work mode signal input terminal of the signal input circuit 100 for receiving an input work mode signal. The input terminals of the work mode signal units 111 through 11J are coupled to multiple work mode signal pins Workmode_pin[1] through Workmode_pin[J] of the chip, respectively. The output terminals of the work mode signal units 111 through 11J output work mode signals Workmode_sig[1] through Workmode_sig[J] which are received from the work mode signal pins Workmode_pin[1] through Workmode_pin[J] of the chip, respectively. The input terminals of the functional signal units 121 through 12K are used as functional signal input terminals of the signal input circuit 100 and coupled to multiple functional signal pins Function_pin[1] to Function_pin[K] of the chip, respectively. The output terminals of the functional signal units 121 through 12K output functional signals Function_sig[1] to Function_sig[K] which are received from the functional signal pins Function_pin[1] to Function_pin[K], respectively. Conventionally, the signal unit is implemented by a flip-flop. As shown in FIG. 1, each work mode signal unit and each functional signal unit both include a flip-flop.

In operation, the work mode of the chip will not be changed while the chip is operating in a work mode, which means that the work mode signal is used to determine the work mode of the chip only when the chip is powered on, and the work mode signal is not changed thereafter. However, the signal from the work mode signal pin of the chip may be changed for some reasons, and the changed work mode signal can be output through the flip-flop in the work mode signal unit. Thus, the work mode of the chip will be changed. This situation should not be expected when the chip has operated in one work mode. In addition, by using the conventional signal input circuit shown in FIG. 1, each work mode signal of the chip requires a pin. Thus, pins are not efficiently used, especially in situations where the chip does not contain enough pins.

SUMMARY

The embodiments described herein relate to methods, circuits, and chips for inputting signals.

In one embodiment, a signal input circuit is disclosed. The signal input circuit includes a control signal input terminal configured for receiving a control signal; at least one common signal input terminal each configured for receiving a corresponding common signal; at least one first signal output terminal each configured for outputting a corresponding first signal; at least one first signal unit, wherein an input terminal of each of said at least one first signal unit is coupled to said at least one common signal input terminal, wherein an output terminal of each of said first signal unit is coupled to said at least one first signal output terminal, and wherein said first signal unit includes a latch unit configured for receiving said corresponding common signal and outputting said corresponding common signal as said corresponding first signal under control of said control signal; at least one second signal output terminal each configured for outputting a corresponding second signal; and at least one second signal unit each configured for receiving said corresponding common signal and outputting said corresponding common signal as said corresponding second signal under control of said control signal, wherein an input terminal of said at least one second signal unit is coupled to said at least one common signal input terminal, wherein an output terminal of each of said at least one second signal unit is coupled to said at least one second signal terminal, and wherein each second signal unit is configured for receiving a corresponding common signal and outputting the corresponding common signal as a second signal based on the control signal.

In another embodiment, a method for inputting a plurality of signals is disclosed. The method includes the steps of inputting a control signal with a first voltage level to reset or set a second signal unit and to enable a latch unit in a first signal unit to receive a common signal from a corresponding common signal input terminal and output said common signal as a first signal, wherein said latch unit and said second signal unit are coupled to said corresponding common signal input terminal; and inputting said control signal with a second voltage level which is inverse to the first voltage level to latch said latch unit to latch a previously received corresponding common signal, and to enable said second signal unit to receive said corresponding common signal from said corresponding common signal input terminal and output said corresponding common signal as a second signal.

In yet another embodiment, a chip with a signal input circuit is disclosed. The chip includes a control signal pin configured for inputting a control signal; at least one common signal pin configured for inputting a corresponding common signal; and a signal input circuit configured for receiving said control signal, receiving said corresponding common signal and outputting said corresponding common signal as at least one of a first signal and a second signal under control of said control signal, wherein a control signal input terminal of said signal input circuit is coupled to said control signal pin, and wherein said at least one common pin is coupled to a corresponding common signal input terminal of said signal input circuit.

Additional advantages and novel features will be set forth in part in the description which follows, and in part will become apparent to those skilled in the art upon examination of the following and the accompanying drawings or may be learned by production or operation of the disclosed embodiments. The advantages of the present embodiments may be realized and attained by practice or use of various aspects of the methodologies, instrumentalities and combinations set forth in the detailed description set forth below.

BRIEF DESCRIPTION OF THE DRAWINGS

Features and advantages of embodiments of the claimed subject matter will become apparent as the following detailed description proceeds, and upon reference to the drawings, wherein like numerals depict like parts. These exemplary embodiments are described in detail with reference to the drawings. These embodiments are non-limiting exemplary embodiments, in which like reference numerals represent similar structures throughout the several views of the drawings.

DETAILED DESCRIPTION

Reference will now be made in detail to the embodiments of the present teaching. While the present teaching will be described in conjunction with these embodiments, it will be understood that they are not intended to limit the present teaching to these embodiments. On the contrary, the present teaching is intended to cover alternatives, modifications and equivalents, which may be included within the spirit and scope of the present teaching as defined by the appended claims.

Furthermore, in the following detailed description of the present teaching, numerous specific details are set forth in order to provide a thorough understanding of the present teaching. However, it will be recognized by one of ordinary skill in the art that the present teaching may be practiced without these specific details. In other instances, well known methods, procedures, components, and circuits have not been described in detail as not to unnecessarily obscure aspects of the present teaching.

In the present teaching and embodiments described herein, the number of pins of a chip with a signal input circuit may be decreased by sharing certain signal input terminals of the signal input circuit.

Figure 1:
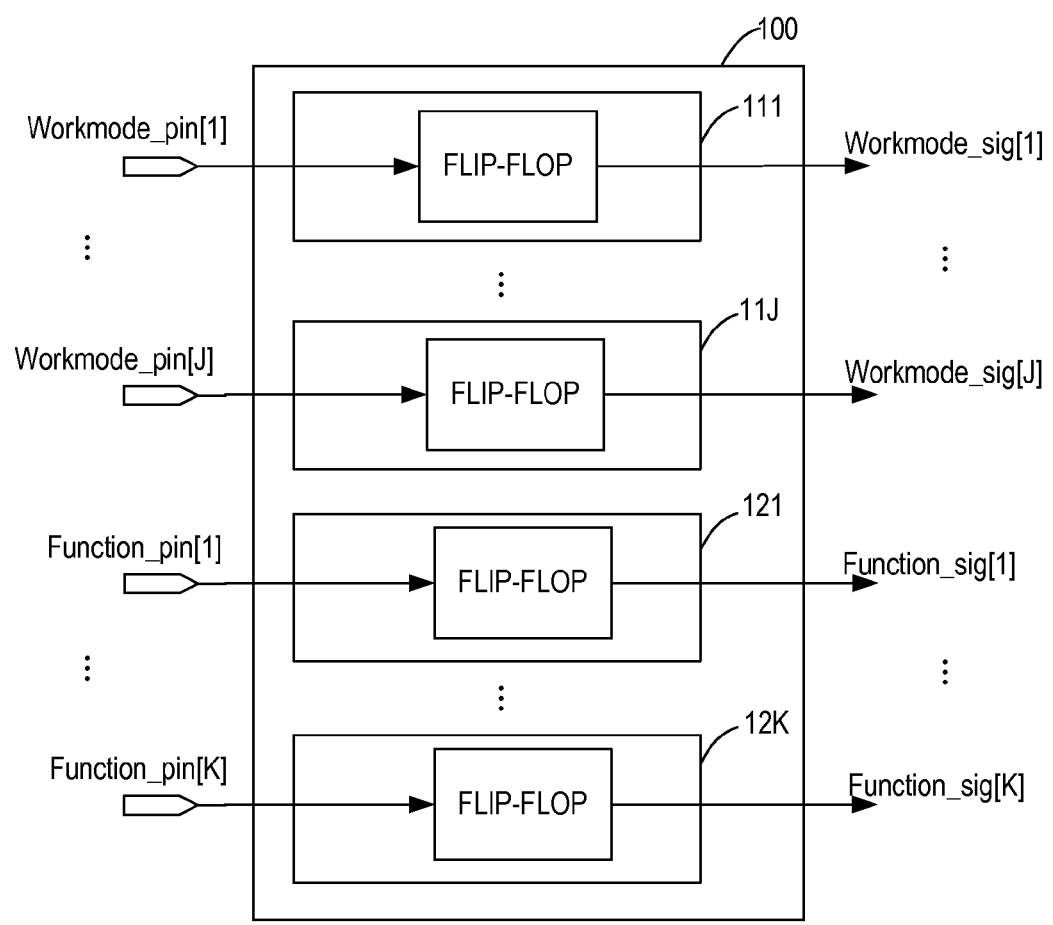
FIG. 1 is a block diagram illustrating a conventional signal input circuit of a chip.
Figure 2:
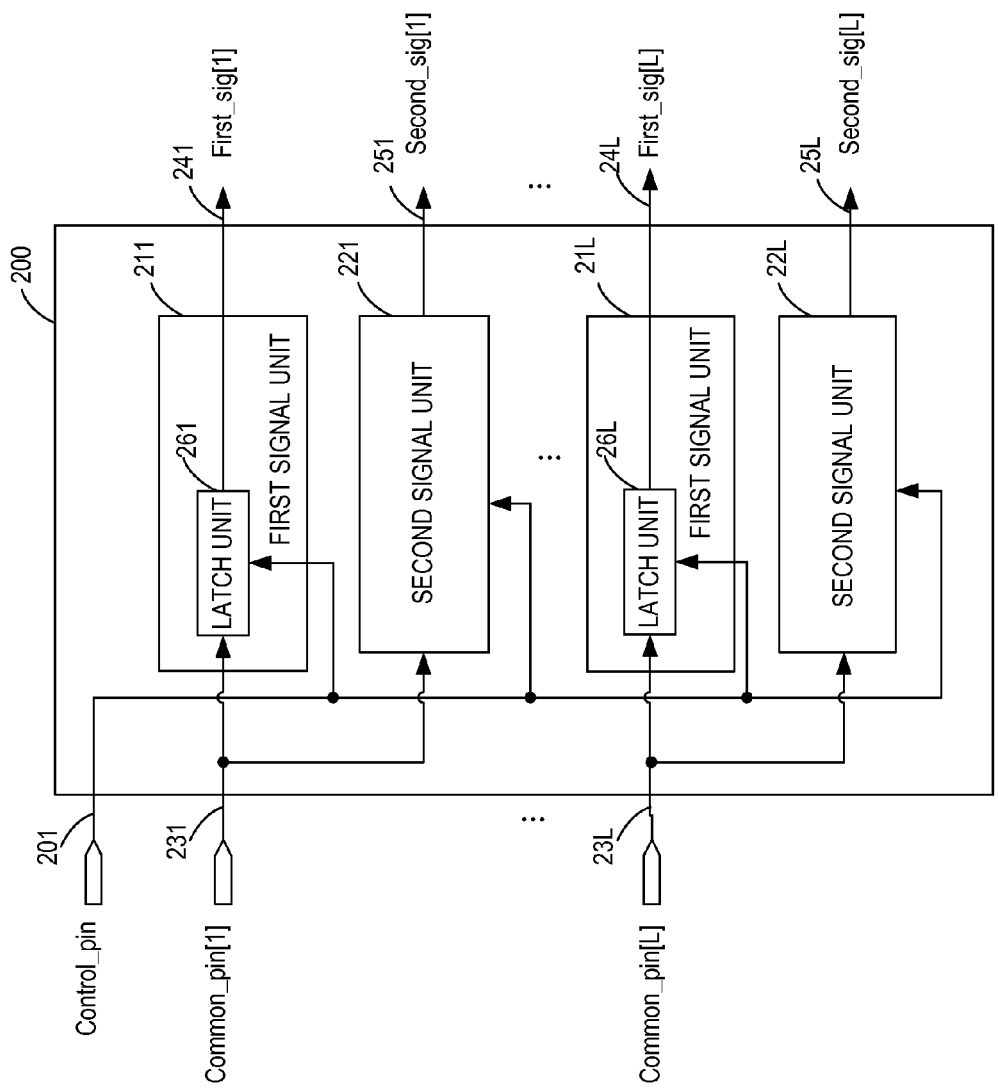
FIG. 2 is a block diagram illustrating an example of a signal input circuit, in accordance with one embodiment of the present disclosure.

FIG. 2 illustrates an example of a signal input circuit 200, in accordance with one embodiment of the present disclosure. As shown in FIG. 2, the signal input circuit 200 includes a control signal input terminal 201, that is configured to receive an external control signal Control_sig, for example, but it is not so limited, through a control pin Control_pin of a chip in which the signal input circuit 200 is integrated; multiple common signal input terminals 231 through 23L, that are configured to receive multiple external common signals Common_sig[1] to Common_sig[L] respectively, for example, but it is not so limited, through common pins Common_pin[1] to Common_pin[L] of the chip in which signal input circuit 200 is integrated, respectively, wherein number L is a positive integer; multiple first signal output terminals 241 through 24L, that are configured to output multiple first signals First_sig[1] to First_sig[L], respectively; and multiple second signal output terminals 251 through 25L, that are configured to output second signals Second_sig[1] to Second_sig[L], respectively. The signal input circuit 200 further includes multiple first signal units 211 through 21L and multiple second signal units 221 through 22L.

In one embodiment, the input terminals of the first signal units 211 through 21L are coupled to the common signal input terminals 231 through 23L respectively; and the output terminals of the first signal units 211 through 21L are coupled to the first signal output terminals 241 through 24L respectively. In one embodiment, each of the first signal units 211 through 21L includes a latch unit. For example, as shown in FIG. 2, the first signal unit 211 includes a latch unit 261, and the first unit 21L includes a latch unit 26L. An enable terminal of each latch unit is controlled by the control signal Control_sig input through the control signal input terminal 201. Each latch unit receives a corresponding common signal under control of the control signal Control_sig and outputs the corresponding common signal as a first signal.

The input terminals of the second signal units 221 through 22L are coupled to the common signal input terminals 231 through 23L respectively; and the output terminals of the second signal units 221 through 22L are coupled to the second signal output terminals 251 through 25L respectively. A control terminal of each second signal unit is controlled by the control signal Control_sig input through the control signal input terminal 201. Each of the second signal units 221 through 22L receives a corresponding common signal under control of the control signal Control_sig and outputs the corresponding common signal as a second signal.

More specifically, when the voltage level of the control signal Control_sig is in a first voltage level, such as logic zero, each of the latch unit 261 through 26L in the corresponding first signal units 211 through 21L is enabled to receive a corresponding common signal and output the corresponding common signal as the first signal, while the second signal units 221 through 22L are reset or set. When the voltage level of the control signal Control_sig is in a second voltage level which is inverse to the first voltage level, such as logic one, each of the second signal units 211 through 21L receives a corresponding common signal and outputs the corresponding common signal as a second signal, while each of the latch unit 261 through 26L in the corresponding first signal units 211 through 22L latches a common signal which is received previously.

However, it should be understood that the voltage level represents a logic voltage level, and the value of a signal represents a logic value of the signal. Logic value indicates a logic voltage level, for example, logic one may represent a high voltage level and logic zero may represent a low voltage level.

In the signal input circuit 200, the second signal unit can be implemented by any signal unit, and not limited to the signal unit disclosed herein. For example, the second signal unit can be implemented by two D-type flip-flops which are coupled in series.

It should be understood that number L is a positive integer and is just used for exemplary purposes. In other words, signal input circuit 200 can include at least one common signal input terminal, at least one first signal output terminal, at least one first signal unit, at least one second signal output terminal, and at least one second signal unit.

The common signal input terminals 231 through 23L can be shared by the first signal units 211 through 21L and the second signal units 221 through 22L simultaneously. The first signal units 211 through 21L and the second units 221 through 22L output the first signals and the second signals under control of the control signal, respectively. Therefore, the number of the input terminals in the signal input circuit in accordance with one embodiment of the present disclosure is decreased. The chip with signal input circuit disclosed in the present disclosure can use fewer pins for inputting signals. In one embodiment, the first signal includes a work mode signal and the second signal includes a functional signal.

Figure 3:
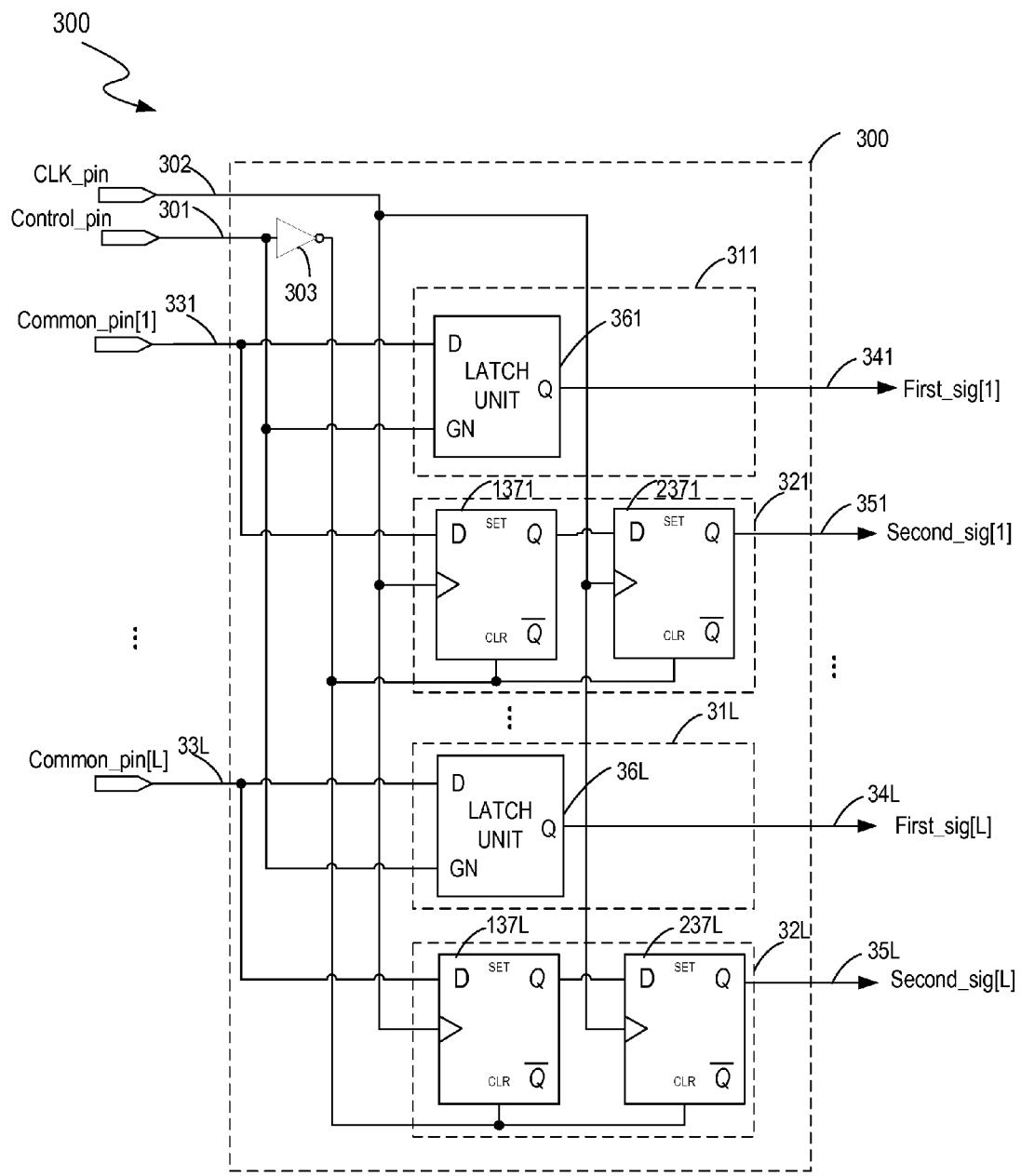
FIG. 3 is a detailed block diagram illustrating an example of a signal input circuit as shown in FIG. 2, in accordance with one embodiment of the present disclosure.

FIG. 3 illustrates a detailed block diagram of the signal input circuit 200 as shown in FIG. 2 and described above. As shown in FIG. 3, each of the first signal units 311 through 31L includes a latch unit. The input terminals D of the latch units 361 through 36L are used as the input terminals of the first signal units 311 through 31L respectively and are coupled to the common signal input terminals 331 through 33L respectively. The output terminals Q of the latch units 361 through 36L are used as the output terminals of the first signal units 311 through 31L respectively and are coupled to the first signal output terminals 341 through 34L of the signal input circuit 300 respectively. Each latch enable terminal GN is coupled to the control signal input terminal 301 to receive the control signal Control_sig. In one embodiment, the latch unit is enabled when the voltage level at the latch enable terminal GN is in a low voltage level. That is, when the voltage level of a signal at the latch enable terminal GN is logic one, the latch unit latches the signal which was previously input. When the voltage level of the signal at the latch enable terminal GN is logic zero, the latch unit is enabled, and then the output signal from the latch unit is the same as the input signal to the latch unit.

Each of the second signal units 321 through 32L includes two D-type flip-flops 137$j$ and 237$j$ (1≤$j$≤L) coupled in series. For example, the second signal unit 321 includes two D-type flip-flops 1371 and 2371, and the second signal unit 32L includes two D-type flip-flops 137L and 237L, as shown in FIG. 3. It should be understood that the second signal unit can be implemented by any signal unit. Moreover, each of the second signal units can include more than two D-type flip-flops coupled in series. Furthermore, the flip-flop is not limited to D-type flip-flops. Other types of flip-flops, such as J-K flip-flops or S-R flip-flops, can also be used to implement the second signal unit.

In a D-type flip-flop, the reset terminal and the set terminal of a flip-flop are active high, i.e. the reset terminal and the set terminal are enabled when the signals at the reset and set terminals are logic one. According to the type of flip-flop used, the reset terminal and the set terminal can also be active low. When the signal at the set terminal SET of a flip-flop is active, for example, due to a high voltage level, the output signal from the output terminal D of the flip-flop is logic one. When the signal at the reset terminal CLR of the flip-flop is active, for example, due to a high voltage level, the output signal from the output terminal Q of the flip-flop is logic zero.

As shown in FIG. 3, in each of the second signal units 32$j$ (1≤$j$≤L), the input terminal D of the first flip-flop 137$j$ is used as the input terminal for each second signal unit 32$j$ and is coupled to a common signal input terminal 33$j$. The input terminal D of a second flip-flop 237$j$ which is on the right of the first flip-flop 137$j$ is coupled to the output terminal Q of the first flip-flop 137$j$, and the output terminal Q of the second flip-flop 237$j$ is used as the output terminal of the second signal unit 32$j$. The control signal input terminal 301 is coupled to each reset terminal CLR of the flip-flops in the second signal units through an inverter 303.

In a situation where each of the second signal units 321 through 32L includes more than two flip-flops coupled in series, the input terminal of the first flip-flop is used as the input terminal of the corresponding second signal unit, the input terminal of each of the other flip-flops is coupled to the output terminal of a left adjacent flip-flop, and the output terminal of a right-most flip-flop is used as the output terminal of the corresponding second signal unit.

In one embodiment, the control signal input terminal 301 is further coupled to each of the set terminals SET of the flip-flops in the second signal units 321 through 32L through an inverter 303. In one embodiment, the reset terminal and the set terminal of each flip-flop are active high. When the value of the signal at the terminal SET or terminal CLR is logic one, the flip-flop is set or reset. The output signal from the flip-flop is logic one while the flip-flop is being set, and the output signal from the flip-flop is logic zero while the flip-flop is reset. The input signal to the flip-flop is not output while the flip-flop being set or reset. Additionally, a clock signal input terminal 302 may receive an external clock signal, for example, from a clock pin CLK_pin of a chip with the signal input circuit 300, and provides the clock signal CLK_sig to each flip-flop. When the clock signal CLK_sig remains at a constant level, for example, logic zero or logic one, the state of the flip-flop stays constant. When the clock signal CLK_sig is rising from logic zero to logic one, and if both the terminal SET and the terminal CLR of the flip-flop are invalid, the output terminal Q of the flip-flop samples the signal at the input terminal D of the flip-flop such that the output signal from the flip-flop is same as the input signal to the flip-flop.

In the signal input circuit 300 shown in FIG. 3, the voltage levels for enabling the latch units in the first signal units 311 through 31L are opposite to the voltage levels for resetting or setting the flip-flops in the second signal units 321 through 32L. Therefore, to ensure that the first signal units 311 through 31L and the second signal units 321 through 32L are controlled under the control signal without conflict, the inverter 303 is added between the control signal input terminal 301 and each of the input terminals of the second signal units 321 through 32L. As shown in FIG. 3, the input terminal of the inverter 303 is coupled to the control signal input terminal 301, and the output terminal of the inverter 303 is coupled to each of the terminals CLR of the flip-flops in the second signal units 321 through 32L. Alternatively, the output terminal of the inverter 303 can be further coupled to the each of the terminals SET of the flip-flops. The inverter 303 reverses the control signal from the control signal input terminal 301 and outputs a reversed control signal to each of the second signal units 321 through 32L. The control signal input terminal 301 is coupled to each of the latch enable terminals GN in the first signal units 311 through 31L directly and outputs the control signal to each of the first signal units 311 through 31L.

Therefore, when the latch units 361 through 36L in the first signal units 311 through 31L output received signals instead of latching these received signals, the second signal units 321 through 32L are reset (or set). When the latch units 361 through 36L in the first signal units 311 through 31L latch signals which have previously been received, each of the second signal units 321 through 32L outputs a corresponding received signal.

In one embodiment, the inverter 303 can further be located between the control signal input terminal 301 and each of the latch enable terminals of the latch units 361 through 36L in the first signal units 311 through 31L to obtain a signal for each of latch enable terminals of the latch units 361 through 36L which is opposite to the signal received by each of the reset terminals CLR or set terminals SET of the flip-flops in the second signal units 321 through 32L. That is, the input terminal of the inverter 303 is coupled to the control signal input terminal 301, and the output terminal of the inverter 303 is coupled to each of the latch enable terminals of the latch units 361 through 36L in the first signal units 311 through 31L. The inverter 303 reverses the control signal from the control signal input terminal 301 and outputs the reversed control signal to the first signal units 311 through 31L, and the control signal input terminal 301 is coupled to the each of the reset terminals CTR or each of the set terminals SET of the flip-flops in the second signal units 321 through 32L directly, and then outputs the control signal to the second signal units 321 through 32L.

Moreover, in one embodiment, when the voltage level for enabling the latch units 361 through 36L in the first signal units 311 through 31L is the same as the voltage level for resetting or setting the flip-flops in the second signal units 321 through 32L, the inverter is not needed.

Figure 4:
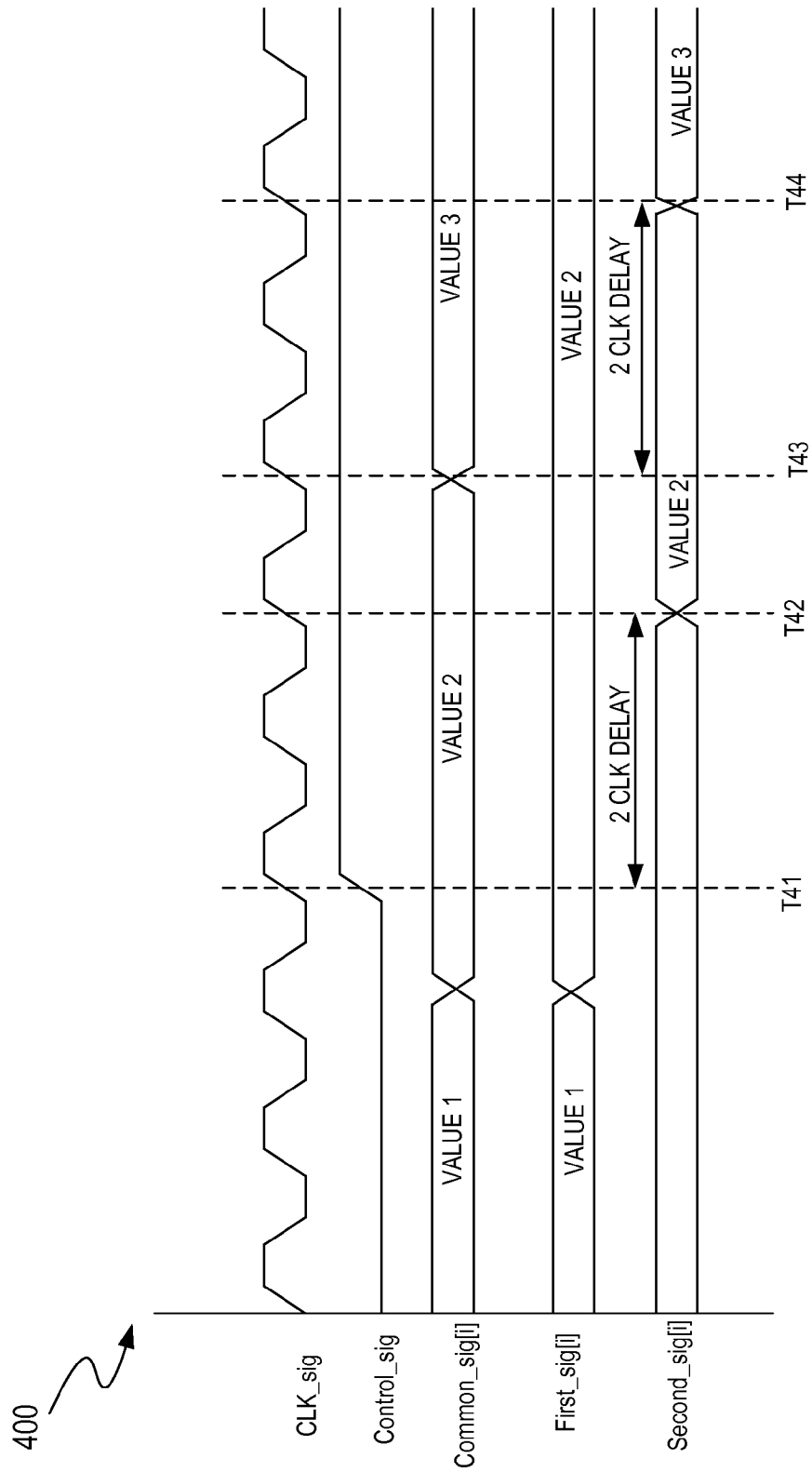
FIG. 4 is a timing diagram of signals associated with a signal input circuit, in accordance with one embodiment of the present disclosure.

FIG. 4 illustrates a timing diagram of signals associated with a signal input circuit, in accordance with one embodiment of the present disclosure. FIG. 4 is described in combination with FIG. 3. The signal input circuit described in FIG. 3 includes multiple first signal units 311 through 31L and multiple second signal units 321 through 32L. Each of the first signal units 311 through 31L performs similar functions. Each of the second signal units 321 through 32L performs similar functions as well. For simplicity, FIG. 4 illustrates a timing diagram of signals associated with a first signal unit 311 and a second signal unit 32i as shown in FIG. 3. The first signal unit 311 and the second signal unit 32i are coupled to a common signal input terminal 33i (wherein i is a positive integer and less than or equal to L). Details of timing diagrams of signals in other first signal units and other second signal units are omitted here for purposes of brevity and clarity. The common signal Common_sig[i] is from a common signal input terminal 33i that is coupled to the first signal unit 311 and the second signal unit 32i.

As shown in FIG. 4, when the control signal Control_sig from the control signal input terminal 301 is in a first voltage level (for example, logic zero), the latch unit 36i in the first signal unit 31i is enabled for outputting a received signal. For example, the first signal unit 31i receives the common signal Common_sig[i] from the common signal input terminal 33i and outputs the common signal Common_sig[i] as a first signal First_sig[i]. Therefore, FIG. 4 illustrates that the value of the first signal First_sig[i] output from the first signal unit 31i is the same as the value of the common signal Common_sig[i], and the output first signal is changed in accordance with the common signal Common_sig[i]. Meanwhile, each flip-flop in the second signal unit 32i is reset and outputs logic zero, therefore, the second signal Second_sig[i] output from the second signal unit 32i is logic zero. Alternatively, in one embodiment, in a situation that the output terminal of the inverter 303 is coupled to each set terminal SET of the flip-flops 137i and 237i in the second signal unit 32i, if the control signal Control_sig from the control signal input terminal 301 is in the first voltage level (for example, logic zero), each flip-flop in the second signal unit 32i is set and outputs logic one, and therefore the second signal Second_sig[i] from the second signal unit 32i is logic one.

At a time T41, the clock signal CLK_sig is at a rising edge. The control signal from the control signal input terminal 301 turns to a second voltage level (for example, logic one). The latch unit 36i in the first signal unit 311 latches a common signal which is received previously. The flip-flops 137i and 237i in the second signal unit 32i samples the signal from the common signal input terminal 33i, receives a corresponding common signal Common_sig[i] from the common signal input terminal 33i, and outputs the received corresponding common signal Common_sig[i] as a second signal Second_sig[i]. In one embodiment shown in FIG. 3, as the second signal unit 32i includes two flip-flops 137i and 237i coupled in series, the common signal Common_sig[i] received from a common pin Common_pin[i] will be output from the second signal unit 32i after two clock cycles (2 CLK delay), i.e., at a time T42 when the clock signal CLK_sig is at a rising edge, the second signal Second_sig[i] with a value of value2 is transmitted to the output terminal of the second signal unit 32i and output by the second signal unit 32i.

At a time T43, the value of the common signal Common_sig[i] is value3. The latch unit 36i in the first signal unit 311 is still latched, and the first signal First_sig[i] output from the first signal unit 311 remains at the value2 which is latched previously. After two clock cycles, i.e., at a time T44 when the clock signal CLK_sig is at a rising edge, the second signal Second_sig[i] output from the second signal unit 32i is at value3.

Advantageously, by using the latch unit to implement the first signal unit, the first signal First_sig[i] output from the first signal unit 31i stays constant even when the common signal Common_sig[i] is changed. For example, when the common signal Common_sig[i] is changed from value2 to value3, the latch unit latches the common signal received previously, thus, the first signal First_sig[i] output from the first signal unit 31i remains stable.

In one embodiment, the value of the first voltage level and value of the second voltage level is not limited to the values described with respect to FIG. 4. These voltage levels can be determined based on the specific components of the signal input circuit, only if the first voltage level is opposite to the second voltage level. For example, in a situation that the control signal input terminal 301 shown in FIG. 3 is coupled to the each latch enable terminal GN of each latch unit instead of each reset terminal CLR of each flip-flop, if the control signal Contro_sig is in the first voltage level, e.g., logic one, each latch unit in the first signal units is enabled and outputs a received signal, and each flip-flop in the second signal units is reset. If the value of the control signal Contro_sig is in the second voltage level, e.g., logic zero, each latch unit in the first signal units latches a signal received previously, while each of the second signal units outputs a received signal. Details of other situations are omitted here for purposes of clarity and brevity.

In embodiments shown in FIG. 3 and FIG. 4, in the signal input circuit, the number of the first signals may be the same as the number of the second signals. The number of first signals can be different from the number of the second signals in certain circumstances, however. For example, on a chip with multiple work modes, the number of the work mode signals can be less than the number of the functional signals, equal to the number of the functional signals, or greater than the number of the functional signals. When the number of work mode signals is different from the number of functional signals, the number of common signal input terminals can be the same as the lesser number of the above mentioned signals, but it is need not be so limited. In other words, the first signals and the second signals may be received through the common signal input terminals and the remaining first signals or second signals which cannot be received through the common signal input terminals can be transmitted by any appropriate signal unit. For purposes of illustration and example, the number of the first signals may be different from the number of the second signals in the signal input circuit in the following examples, in accordance with embodiments of the present disclosure.

Figure 5:
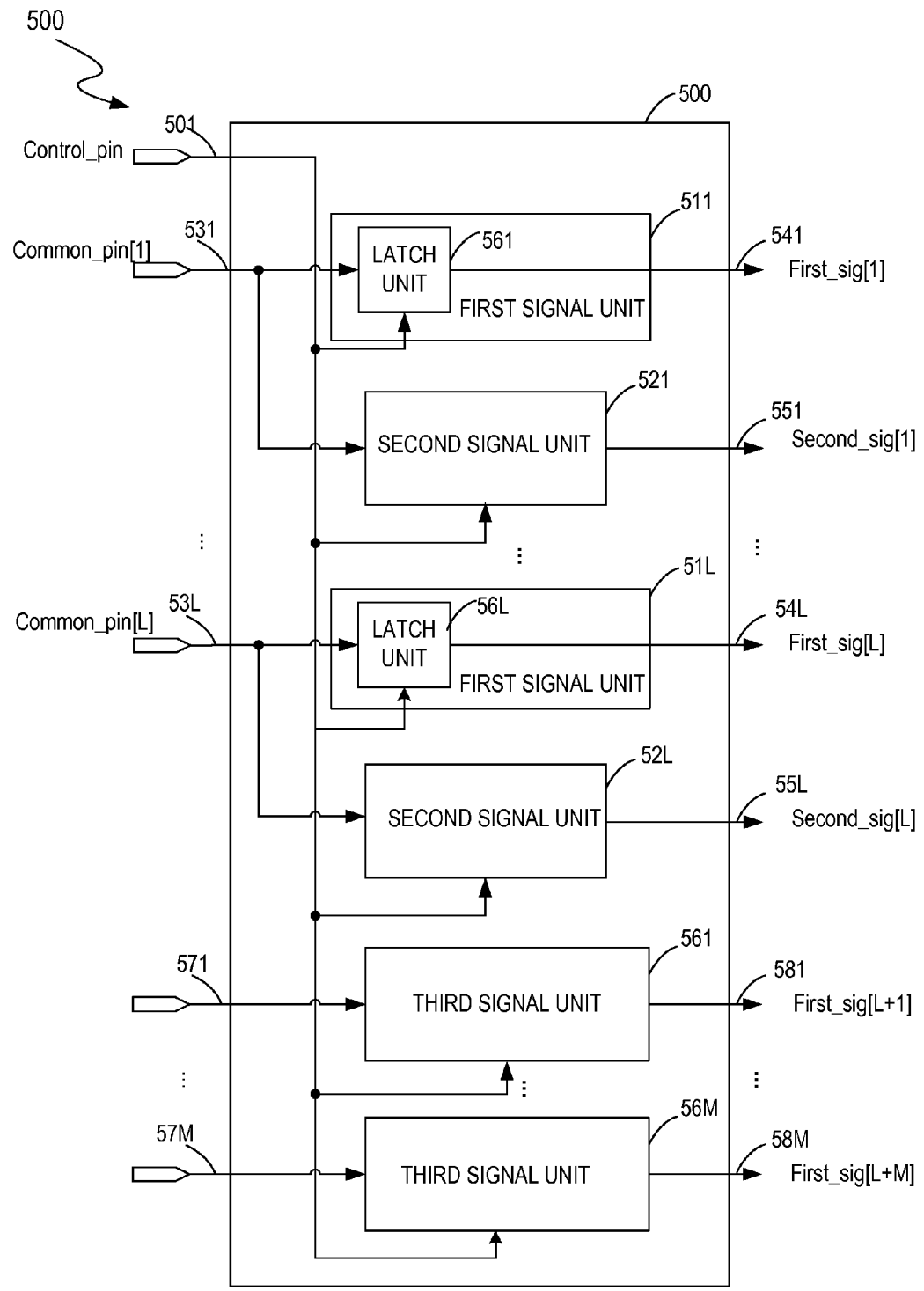
FIG. 5 is a block diagram illustrating another example of a signal input circuit, in accordance with one embodiment of the present disclosure.

FIG. 5 illustrates another example of a signal input circuit, in accordance with one embodiment of the present disclosure. In this embodiment, the number of the first signals is more than the number of the second signals. Comparing with the signal input circuit 200 shown in FIG. 2 and described above, the signal input circuit 500 shown in FIG. 5 further includes multiple third signal input terminals 571 through 57M, each of which is configured to receive a corresponding third signal from, for example, a corresponding first signal input terminal of a chip with the signal input circuit 500, wherein M is a positive integer; multiple third signal output terminals 581 through 58M, each of which is configured to output a corresponding third signal as the first signal; and multiple third signal units 561 through 56M, each of which is configured to receive a corresponding third signal under control of the control signal Control_sig and output the corresponding third signal as the first signal through the corresponding third signal output terminal.

The input terminals of the third signal units 561 through 56M are coupled to the third signal input terminals 571 through 57M respectively. The output terminals of the third signal units 561 through 56M are coupled to the third signal output terminals 581 through 58M respectively. Each control terminal of the third signal units 561 through 56M is coupled to control signal input terminal 501 to receive the control signal Control_sig, and each of the third signal units 561 through 56M receives a corresponding third signal under control of the control signal Control_sig and outputs the corresponding third signal as a first signal.

In this embodiment shown in FIG. 5, the number of the first signals is greater than the number of the second signals, wherein the first signals First_sig[1] to First_sig[L] and the second signals Second_sig[1] to Second_sig[L] are received through the common signal input terminals 531 through 53L, and then are output through the first signal units 511 through 51L and the second signal units 521 through 52L, respectively. The other extra first signals First_sig[L+1] to First_sig[L+M] (in order to avoid confusion, the extra first signals First_sig[L+1] to First_sig[L+M] are called the third signals) are received by multiple third signal input terminals 571 through 57M, respectively, and then are output through the third signal units 561 through 56M, respectively.

The third signal units 561 to 56M may be implemented by any appropriate signal units, or by the first signal units shown in FIG. 2 and described above, in accordance with the embodiments of the present disclosure described herein. The third signal units 561 to 56M will be described in further detail in combination with FIG. 6 and FIG. 7 below.

Furthermore, as shown in FIG. 5, the other sections in the signal input circuit 500, for example, the control signal input terminal 501, the common signal input terminals 531 through 53L, the first signal output terminals 541 through 54L, the second signal output terminals 551 through 55L, the first signal units 511 through 51L and the second signal units 521 through 52L, all have similar components and functions as the corresponding sections in the signal input circuit 200 shown in FIG. 2 and described above, and will not be repetitively described herein for brevity and clarity. In one embodiment, each of first signals and third signals includes a work mode signal while the second signal includes a functional signal.

It should be understood that number M is a positive integer and it is just used purely for purposes of explanation. In other words, the signal input circuit 500 can include at least one third signal input terminal, at least one third signal output terminal, and at least one third signal unit.

Figure 6:
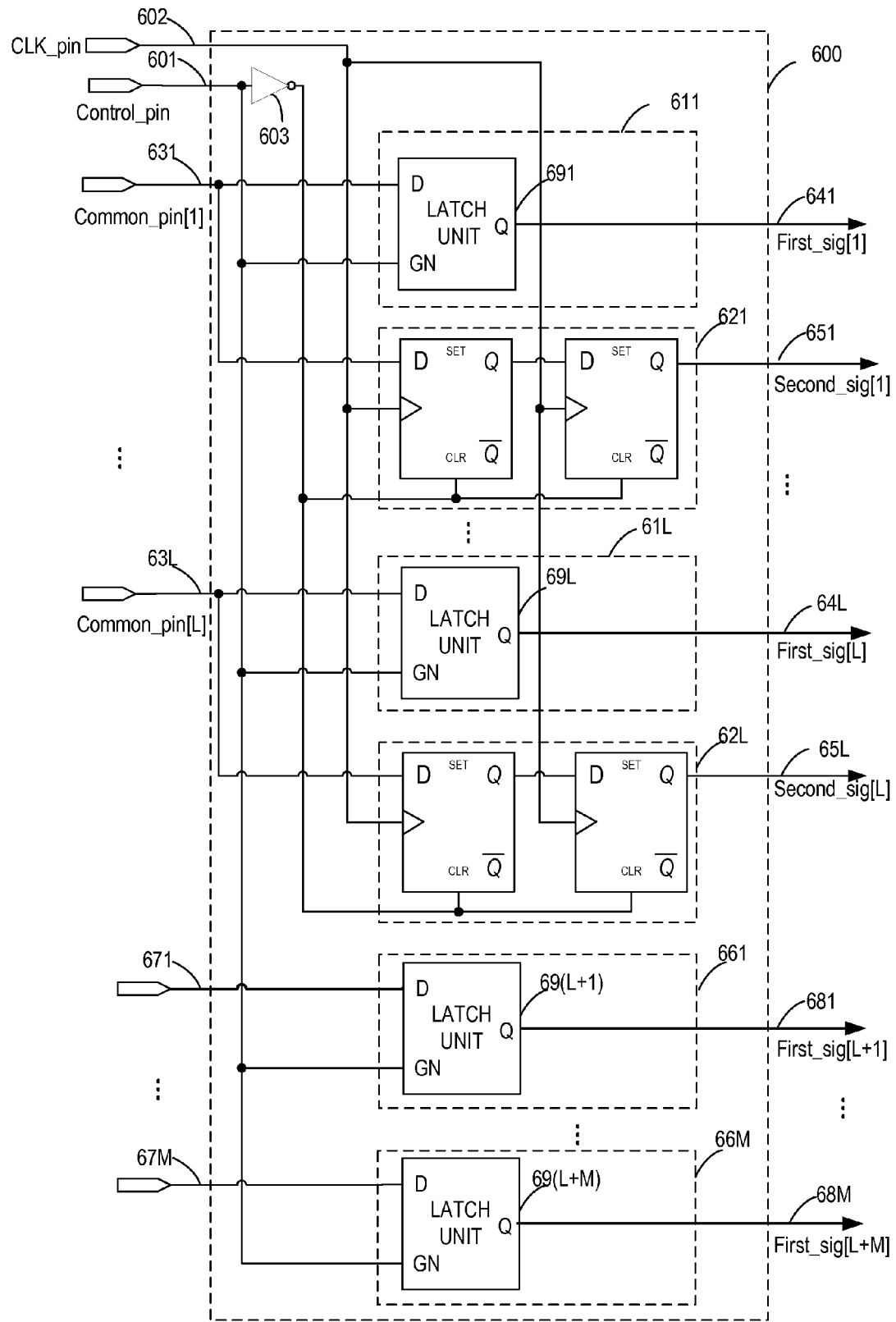
FIG. 6 is a detailed block diagram illustrating an example of a signal input circuit as shown in FIG. 5, in accordance with one embodiment of the present disclosure.

FIG. 6 illustrates another example of a signal input circuit, in accordance with one embodiment of the present disclosure. FIG. 6 illustrates a detailed circuit of signal input circuit 500 as shown in FIG. 5 and described herein. In this embodiment, a latch unit is used in the third signal unit which is not sharing common signal input terminals 631 through 63L with other signal units. Specifically, in the signal input circuit 600, each of the third signal units 661 through 66M includes a latch unit. For example, the third signal unit 661 includes a latch unit 691(L+1), and the third signal unit 66M includes a latch unit 691(L+M). An input terminal D of a latch unit 691(L+k) ($1 \leq k \leq M$) is used as an input terminal of the corresponding third signal unit 66$k$, and an output terminal Q of latch unit 691(L+k) ($1 \leq k \leq M$) is used as an output terminal of the corresponding third signal unit 691(L+k). Each latch enable terminal GN is coupled to the control signal input terminal 601.

Thus, when the control signal is in the first voltage level, for example, logic zero, each latch unit in the third signal units 661 through 66M is enabled, and receives a third signal from a corresponding the third signal input terminal, and outputs the third signal from a corresponding third signal output terminal as a corresponding first signal. When the control signal is in a second voltage level, for example, logic one, each latch unit in the third signal units 661 through 66M latches and outputs the previously received signal.

The other sections in FIG. 6, such as the clock signal input terminal 602, the control signal input terminal 601, the common signal input terminals 631 through 63L, the first signal output terminals 641 through 64L, the second signal output terminals 651 through 65L, the first signal units 611 through 61L and the second signal units 621 through 62L, etc., have similar components and functions as the corresponding sections in the signal input circuit 300 shown in FIG. 3, and will be not repetitively described herein for brevity and clarity.

Figure 7:
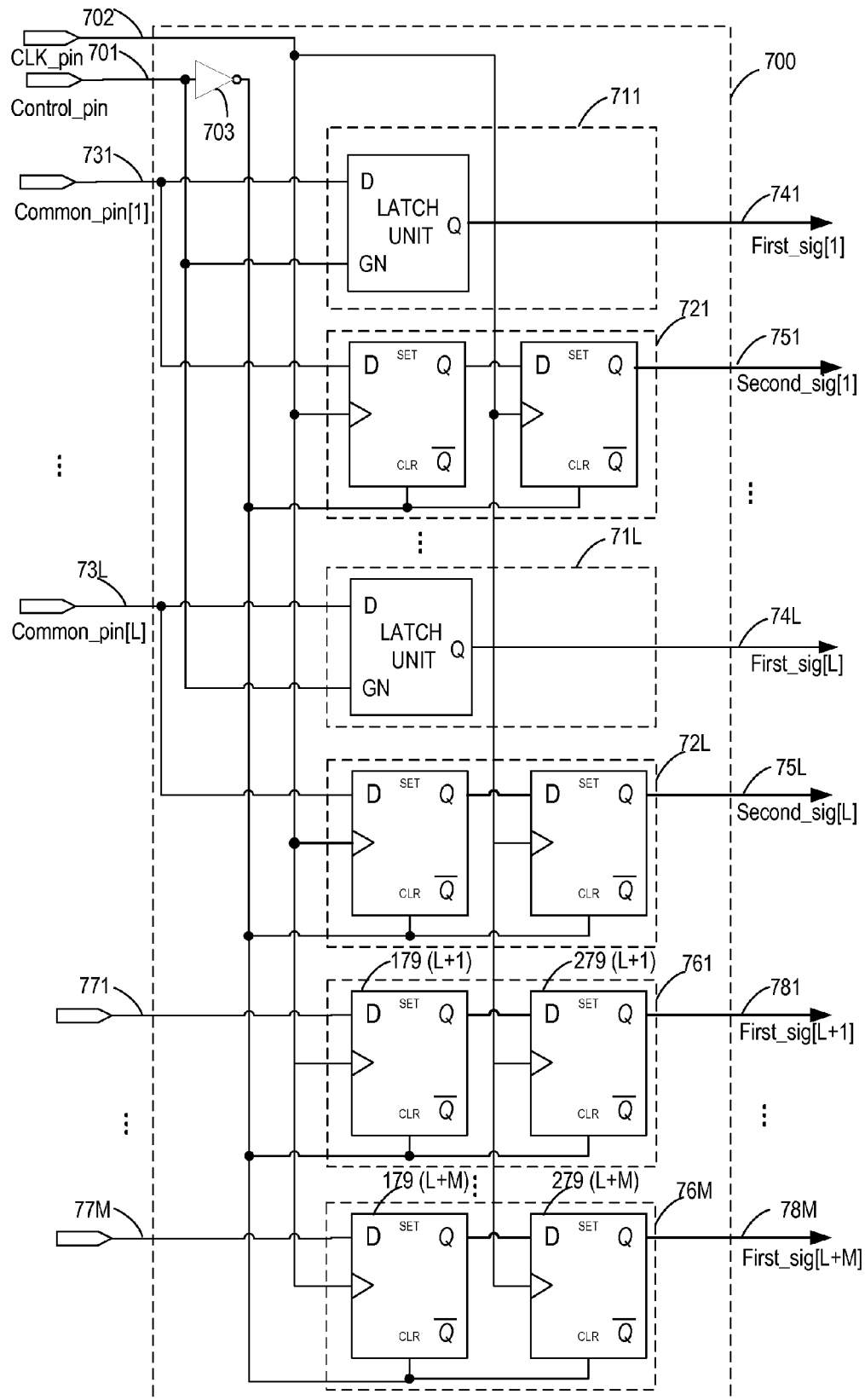
FIG. 7 is a detailed block diagram illustrating another example of a signal input circuit as shown in FIG. 5, in accordance with one embodiment of the present disclosure.

FIG. 7 illustrates another example of a signal input circuit, in accordance with one embodiment of the present disclosure. FIG. 7 illustrates another specific circuit of the signal input circuit 500 as shown in FIG. 5 and described above. In this embodiment, the flip-flop is used in the third signal unit which is not sharing the common signal input terminals 731 through 73L with the other signal units. Specifically, in the signal input circuit 700, each of third signal units 761 through 76M includes two D-type flip-flops coupled in series. It should be understood that each of the third signal units 761 through 76M can further include multiple D-type flip-flops coupled in series, and that the number of the flip-flops depends on the actual requirements. Moreover, the type of the flip-flop is not limited to the D-type flip-flop, for example, it can be a J-K flip-flop, an S-R flip-flop, etc.

In each third signal unit 76k (1≤k≤M), an input terminal of a first flip-flop 179 (L+1) is used as an input terminal of the third signal unit 76k, the input terminal of a second flip-flop 279 (L+1) is coupled to an output terminal of the first flip-flop 179 (L+1), and an output terminal of the second flip-flop 279 (L+1) is used as the output terminal of the third signal unit 76k. An inverter 703 reverses the control signal Control_sig from a control signal input terminal 701 and outputs the reversed control signal to the third signal units 761 through 76M. The control signal input terminal 701 is coupled to the input terminal of the inverter 703, and the output terminal of the inverter 703 is coupled to each reset terminal CLR of each flip-flop in each of the third signal units 761 through 76M. Alternatively, the output terminal of the inverter 703 can be further coupled to each set terminal SET of each flip-flop in the third signal units 761 through 76M.

In a situation where each third signal unit includes multiple (for example, more than two) flip-flops coupled in series, the input terminal of the first flip-flop is used as the input terminal of the corresponding third signal unit, the input terminal of each of the other flip-flops is coupled to the output terminal of a left adjacent flip-flop, and the output terminal of the rightmost flip-flop is used as the output terminal of the corresponding third signal unit.

Thus, each flip-flop in the third signal units 761 through 76M is reset or set when the control signal is in the first voltage level, e.g., logic zero. When the control signal is in a second voltage level, for example, logic one, each of the third signal units 761 through 76M receives a third signal from a corresponding third signal input terminal, and outputs the third signal as a corresponding first signal through a corresponding third signal output terminal.

The other sections in FIG. 7, such as the control signal input terminal 701, a clock signal input terminal 702, the common signal input terminals 731 through 73L, the first signal output terminals 741 through 74L, the second signal output terminals 751 through 75L, the first signal units 711 through 71L, and the second signal units 721 through 72L, etc., all have similar components and functions as the corresponding sections in the signal input circuit 300 shown in FIG. 3, described above, and will be not repetitively described herein for brevity and clarity.

Figure 8:
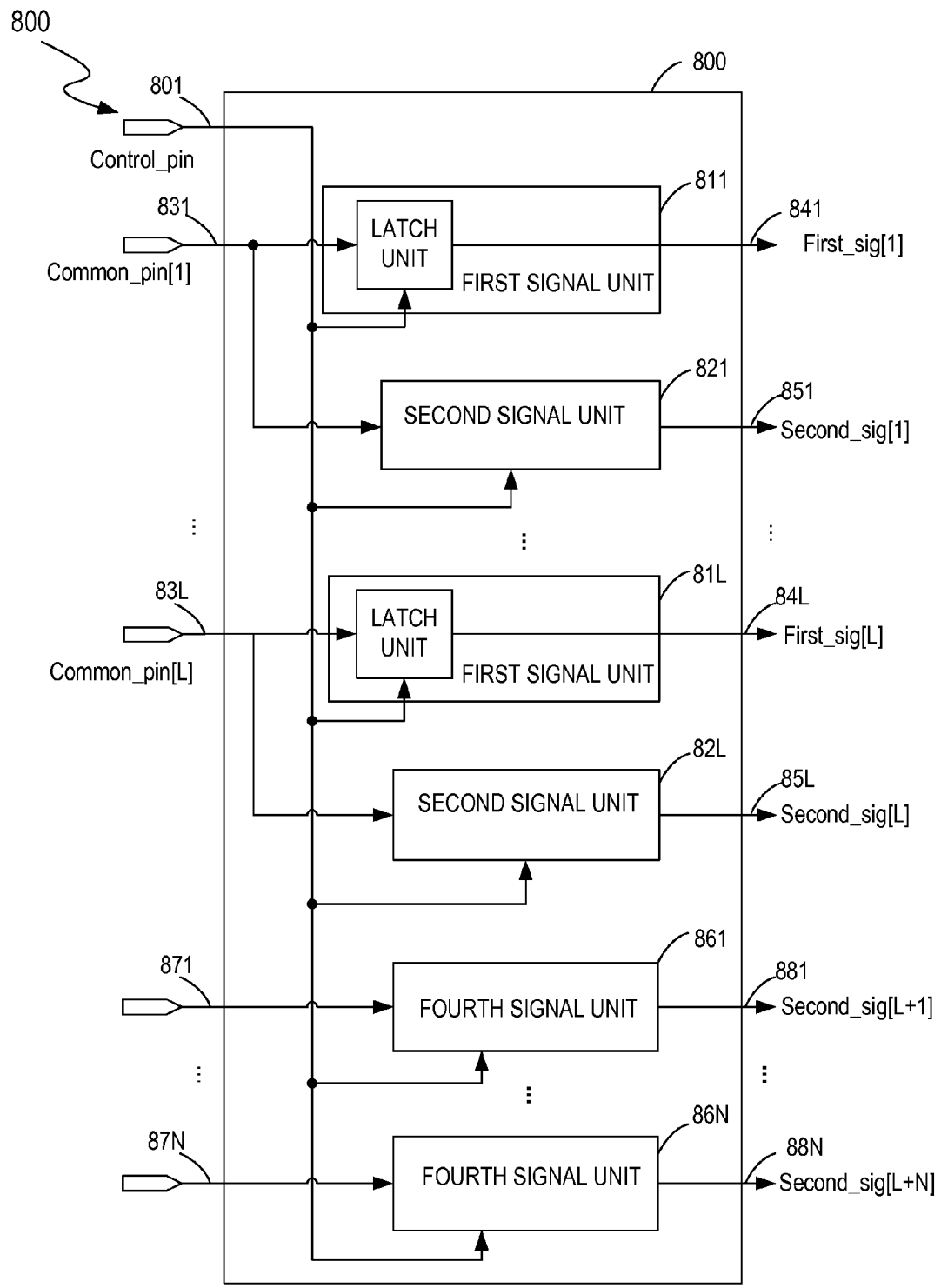
FIG. 8 is a block diagram illustrating another example of a signal input circuit, in accordance with one embodiment of the present disclosure.

FIG. 8 illustrates another example of a signal input circuit, in accordance with one embodiment of the present disclosure. In this embodiment, the number of the second signals is greater than the number of the first signals. Comparing with the signal input circuit 200 as shown in FIG. 2, the signal input circuit 800 as shown in FIG. 8 further includes multiple fourth signal input terminals 871 through 87N, each of which receives a corresponding fourth signal from, for example, a corresponding second signal input terminal of a chip with signal input circuit 800, wherein N is a positive integer; multiple fourth signal output terminals 881 through 88N, each of which outputs a corresponding fourth signal as a second signal; and multiple fourth signal units 861 through 86N, each of which receives a corresponding fourth signal under control of the control signal Control_sig and outputs the corresponding fourth signal as the second signal.

The input terminals of the fourth signal units 861 through 86N are coupled to the fourth signal input terminals 871 through 87N respectively. The output terminals of the fourth signal units 861 through 86N are coupled to the fourth signal output terminals 881 through 88N respectively. Each control terminal of the fourth signal units 861 through 86N is coupled to the control signal input terminal 801 to receive the control signal Control_sig.

In this embodiment, the number of the second signals is greater than the number of the first signals, wherein the second signals Second_sig[1] to Second_sig[L] and the first signals First_sig[1] to First_sig[L] are received through the common signal input terminals 831 through 83L, respectively, and are output through the second signal units 821 through 82L and the first signal units 811 through 81L, respectively. The extra second signals Second_sig[L+1] to Second_sig[L+N] (in order to avoid confusion, the extra second signals Second_sig[L+1] to Second_sig[L+N] are called the fourth signals) are received by corresponding fourth signal input terminals 871 through 87N, and are output by the fourth signal units 861 through 86N, respectively.

The fourth signal units 861 through 86M can be implemented by any appropriate and suitable signal units. The fourth signal units 861 through 86M will be described below in combination with FIG. 11. Furthermore, as shown in FIG. 8, the other sections in the signal input circuit 800, for example, the control signal input terminal 801, the common signal input terminals 831 through 83L, the first signal output terminals 841 through 84L, the second signal output terminals 851 through 85L, the first signal units 811 through 81L and the second signal units 821 through 82L, etc., have similar components and functions as the corresponding sections in the signal input circuit 200 shown in FIG. 2 and described above, and will not be repetitively described herein for brevity and clarity. In one embodiment, the first signal may include a work mode signal, and each of the second signal and the fourth signal may include a functional signal.

It should be understood that number L is a positive integer and is used for purposes of explanation. The signal input circuit 500 may include at least one fourth signal input terminal, at least one fourth signal output terminal, and at least one fourth signal unit.

Figure 9:
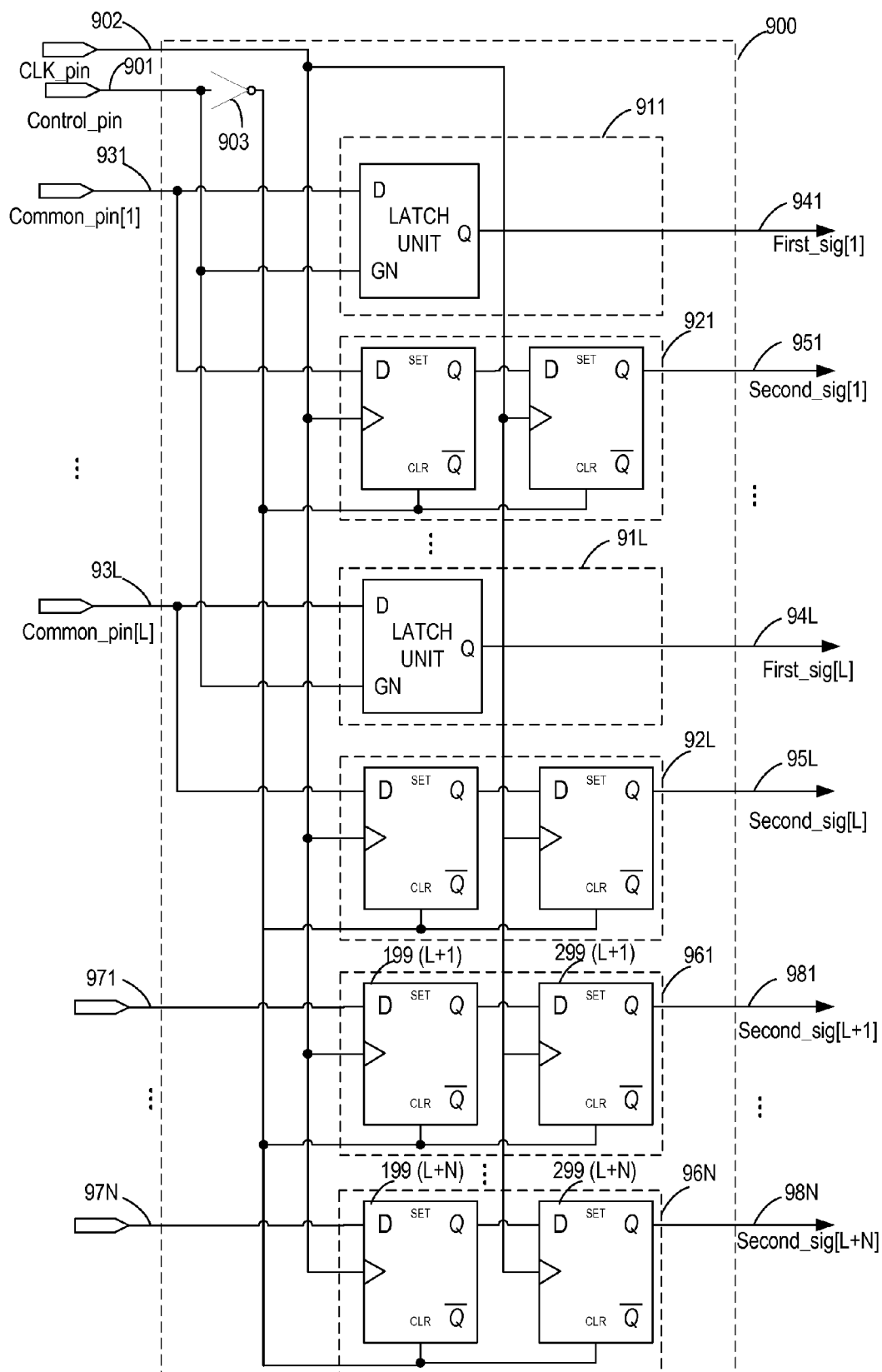
FIG. 9 is a detailed block diagram illustrating an example of a signal input circuit as shown in FIG. 8, in accordance with one embodiment of the present disclosure.

FIG. 9 illustrates another example of a signal input circuit, in accordance with one embodiment of the present disclosure. FIG. 9 illustrates a detailed circuit of the signal input circuit 800 as shown in FIG. 8 and described above. In this embodiment, the flip-flop is used in the fourth signal unit which is not sharing common signal input terminals 931 through 93L with other signal units. Specifically, in the signal input circuit 900, each of fourth signal units 961 through 96N includes two D-type flip-flops coupled in series. It should be understood that each of the fourth signal units 961 through 96N may further include multiple (for example, more than two) D-type flip-flops coupled in series, the number of the flip-flops depends on the actual requirements. Moreover, the type of the flip-flop is not limited to the D-type flip-flop, for example, it can be a J-K flip-flop, an S-R flip-flop, etc.

In each fourth signal unit 96i (1≤i≤N), an input terminal of a first flip-flop 199 (L+i) is used as an input terminal of the fourth signal unit 96i, the input terminal of a second flip-flop 299 (L+i) is coupled to output terminal of the first flip-flop 199 (L+i), and an output terminal of the second flip-flop 299 (L+i) is used as an output terminal of the fourth signal unit 96i. An inverter 903 reverses the control signal Control_sig from a control signal input terminal 901 and outputs the reversed control signal to the fourth signal units 961 through 96N. The control signal input terminal 901 is coupled to the input terminal of the inverter 903, and the output terminal of the inverter 903 is coupled to each reset terminal CLR of each flip-flop in the fourth signal units 961 through 96N. Alternatively, the output terminal of the inverter 903 can be further coupled to each set terminal SET of each flip-flop in the fourth signal units 961 through 96N.

In one embodiment, each fourth signal unit can include multiple (for example, more than two) flip-flops coupled in series. The actual number of the flip-flops depends on the actual requirements. In a situation where each fourth signal unit includes multiple (for example, more than two) flip-flops coupled in series, the input terminal of the first flip-flop is used as the input terminal of the corresponding fourth signal unit, the input terminal of each of the other flip-flops is coupled to the output terminal of a left adjacent flip-flop, and the output terminal of the right-most flip-flop is used as the output terminal of the fourth signal unit.

Thus, each flip-flop in the fourth signal units 961 through 96N is reset or set when the control signal is in the first voltage level, e.g., logic zero. And each of the fourth signal units 961 through 96N receives a fourth signal from a corresponding fourth signal input terminal, and outputs the fourth signal as a corresponding second signal through a corresponding fourth signal output terminal when the control signal is in a second voltage level, e.g. logic one.

The other sections in the signal input circuit 900 in FIG. 9, such as the control signal input terminal 901, a clock signal input terminal 902, the common signal input terminals 931 through 93L, the first signal output terminals 941 through 94L, the second signal output terminals 951 through 95L, the first signal units 911 through 91L and the second signal units 921 through 92L, etc., all have similar components and functions as the corresponding sections in the signal input circuit 300 shown in FIG. 3 and described above, and will be not repetitively described herein for brevity and clarity.

The above-mentioned signal input circuit can be integrated into a chip with multiple work modes, in accordance with one embodiment of the present disclosure. Specifically, the above-mentioned signal input circuit can be a signal input circuit integrated into a chip. In this situation, the first signal may be a work mode signal of the chip, and the second signal may be a functional signal of the chip.

Figure 10:
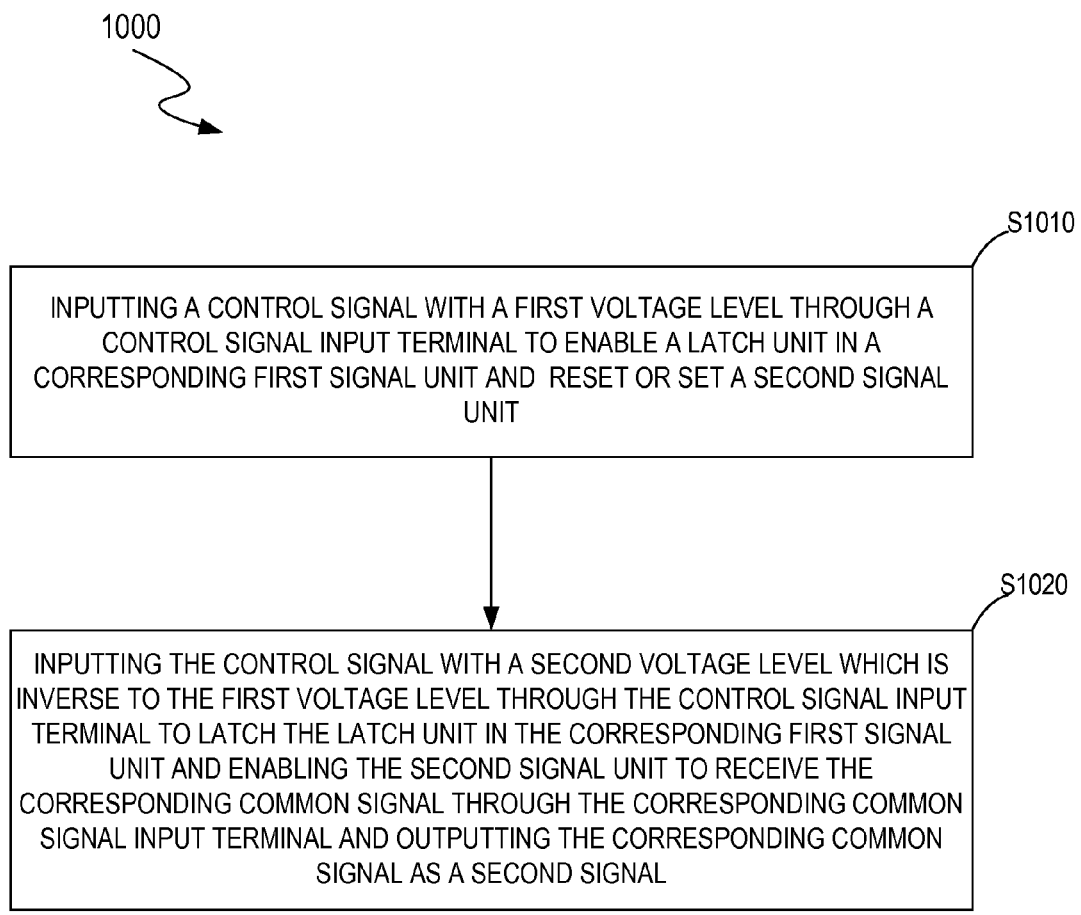
FIG. 10 is a flowchart illustrating a method for inputting signals, in accordance with one embodiment of the present disclosure.

FIG. 10 is a flowchart illustrating a method for inputting signals, in accordance with one embodiment of the present disclosure. The disclosed method as shown in FIG. 10 is implemented by the signal input circuit mentioned above, in accordance with the embodiments of the present disclosure described herein. At step S1010, a control signal with a first voltage level is input through a control signal input terminal to enable a latch unit in a corresponding first signal unit and reset or set a second signal unit. In one embodiment, the latch unit and the second signal unit are coupled to a corresponding common signal input terminal. The latch unit receives a corresponding common signal through the corresponding common signal input terminal and outputs the corresponding common signal as a first signal under control of the control signal.

At step S1020, the control signal with a second voltage level which is inverse to the first voltage level is input through the control signal input terminal to latch the latch unit in the corresponding first signal unit and enable the second signal unit to receive the corresponding common signal through the corresponding common signal input terminal and output the corresponding common signal as a second signal. In one embodiment, the latch unit latches the previously received common signal. The details of performing each of steps S1010 and S1020 are omitted here, as the detailed description of the signal input circuit disclosed in the present disclosure above may serve as a reference.

In one embodiment, a chip with a signal input circuit is disclosed. The chip can include a control signal pin for inputting a control signal; at least one common signal pin, wherein each common signal pin is for inputting a corresponding common signal; and a signal input circuit as mentioned above in accordance with one embodiment of the present disclosure. A control signal input terminal in the signal input circuit is coupled to the control signal pin, wherein each common signal input terminal in the signal input circuit is coupled to each corresponding common signal pin, the signal input circuit receives the control signal from the control signal pin and a corresponding common signal from the corresponding common signal pin and outputs the corresponding common signal as a first signal or a second signal under control of the control signal.

According to the embodiments described herein, the signal input circuit, the method and the chip of the present disclosure, a signal input terminal is shared by a couple of a first signal and a second signal, and a first signal unit and a second signal unit receive common signals and output the common signals as the first signals or the second signals under control of a control signal. Thus, the number of pins of the chip with a signal input circuit is decreased.

Moreover, according to the embodiments described herein, the signal input circuit, the method and the chip of the present disclosure, each first signal unit includes a latch unit. As the latch unit does not need a clock signal, the circuit disclosed in the present disclosure can further reduce power consumption.

Furthermore, by using a latch unit in the first signal unit, when the latch unit in the first signal unit latches the common signal received previously, the signal output from the first signal unit is unchanged even when the signal on the first signal input terminal is changed, so the first signal remains stable.

Figure 11:
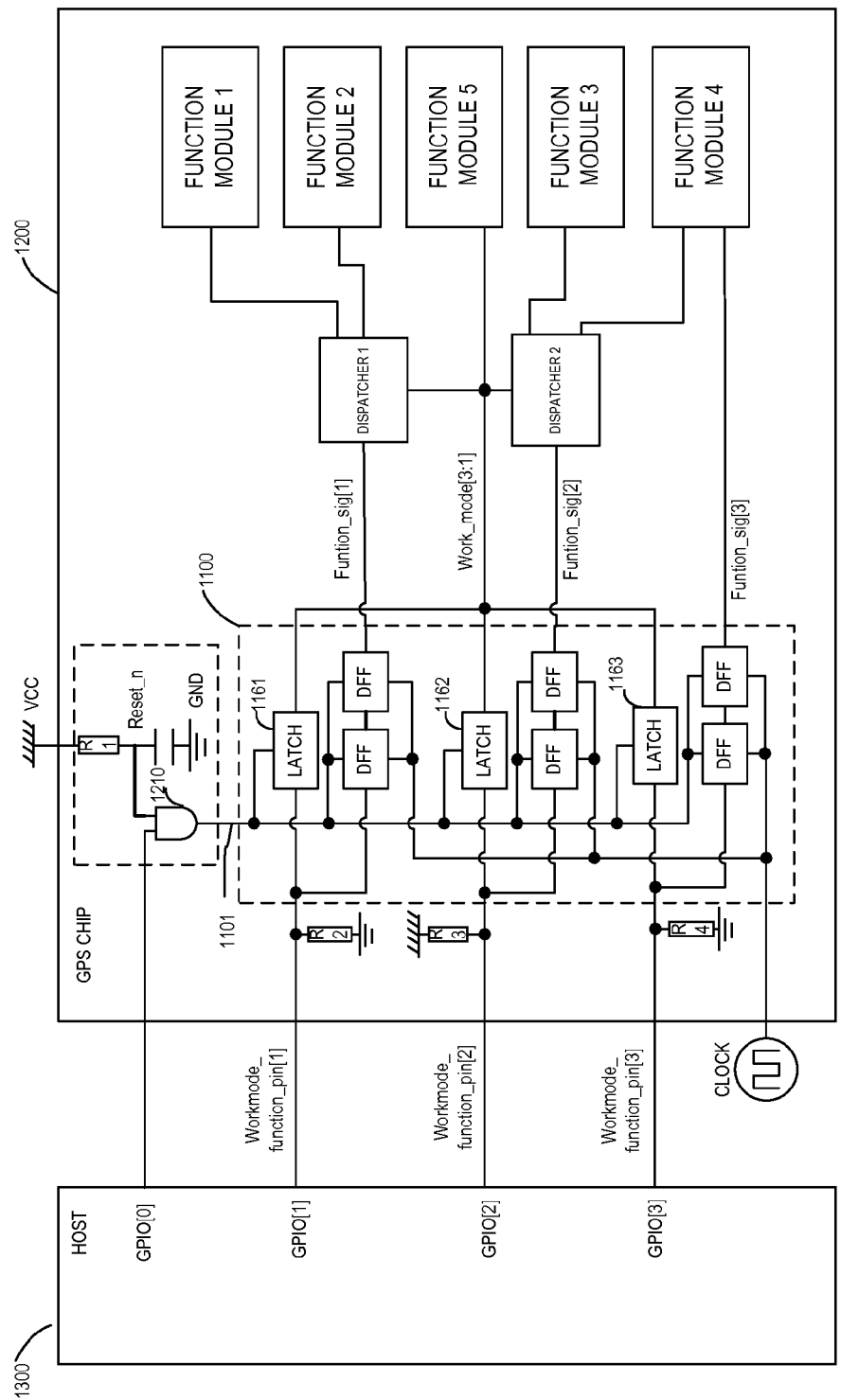
FIG. 11 is a block diagram illustrating an example of a signal input circuit integrated in a GPS chip, in accordance with one embodiment of the present disclosure.

FIG. 11 illustrates an example of a signal input circuit integrated into a Global Positioning System (GPS) chip, in accordance with one embodiment of the present disclosure. As shown in FIG. 11, the signal input circuit 1100 is integrated into the GPS chip 1200. FIG. 11 illustrates a general circuit of the signal input circuit 1100 for simplicity. The GPS chip 1200 includes, but is not limited to, three common signal input pins Workmode_function_pin[1] through Workmode_function_pin[3], a control signal pin, a clock signal pin and a power supply pin. The three common signal input pins Workmode_function_pin[1] through Workmode_function_pin[3] are coupled to multiple General Purpose Input/Output pins GPIO[1] through GPIO[3] on an external device HOST 1300 respectively, the power supply pin is coupled to the power supply VCC, and the clock signal pin receives a clock signal.

An input of an AND gate 1210 receives the power supply VCC via a resistor R1, and the other input of the AND gate 1210 receives a signal which is received by the control signal pin from General Purpose Input/Output pin GPIO[0] on the HOST 1200. The output terminal of the AND gate 1210 is coupled to the control signal input terminal 1101 of the signal input circuit 1100.

When the GPS chip 1200 is powered on, the value of VCC changes from zero to digital one, accordingly, and a reset signal Reset_n which is changed from zero to one slowly is generated. As changes of the reset signal Reset_n occurs slower than that of the power signal VCC, when the value of the VCC has reached digital one, the value of the reset signal Reset_n still remains at zero for a period of time. During this time, the control signal for signal input circuit 1100 is still logic zero. Accordingly, the common signal input pins Workmode_function_pin[1] through workmode_function_pin[3] of signal input circuit 1100 can be used to receive a work mode signal. After that period of time, the signal Reset_n reaches logic one, and when the signal from the HOST through pin GPIO[0] is logic one, the control signal of the signal input circuit 1100 is logic one. Accordingly, the common signal input terminals in the signal input circuit 1100 are used to receive a functional signal.

As shown in FIG. 11, the signal input circuit 1100 includes, but is not limited to, three first signal units and three second signal units. In this embodiment, the first signal unit is a work mode signal unit, and the second signal unit is a functional signal unit. Each work mode signal unit includes a latch unit. Each functional signal unit includes two D-type flip-flops coupled in series.

The input terminals of the three latch units 1161 through 1163 are coupled to the pins GPIO[1], GPIO[2] and GPIO[3] of the HOST 1300 through three common signal input pins Workmode_function_pin[1] through workmode_function_pin[3], respectively. Each output terminal of the three latch units 1161 through 1163 outputs a corresponding work mode signal. The input terminals of the three functional signal units are coupled to the pins GPIO[1], GPIO[2] and GPIO[3] of the HOST 1300 through three common signal input pins Workmode_function_pin[1] through workmode_function_pin[3], respectively. Each output terminal of the three functional signal units outputs a corresponding functional signal. Each latch enable terminal of the three latch units 1161 through 1163 and each reset terminal of the flip-flops are coupled to the control signal input terminal.

When the control signal is logic zero, the three latch units 1161 through 1163 receive the common signals from GPIO[1], GPIO[2] and GPIO[3] in the HOST 1200 respectively, and output the common signals as the work mode signals respectively. When the control signal reaches logic one, the latch units 1161 through 1163 latch the work mode signals received previously. In the signal input circuit 1100, the output signals from the latch units 1161 through 1163 form a three bit signal Workmode_sig[3:1], that determines the work mode of the GPS chip 1200. When the control signal reaches to logic zero, each flip-flop in functional signal units is reset until the control signal reached to logic one. When the control signal reaches logic one, the flip-flops sample the signals from the pins GPIO[1], GPIO[2] and GPIO[3] of the HOST 1300 respectively, and output these sampled signals.

The external device HOST 1300 can output multiple work mode signals of the GPS chip 1200 through the pins GPIO[1], GPIO[2] and GPIO[3] at a time when the GPS chip is powered on or the signal at the pin GPIO[0] is in a low voltage level.

The GPS chip 1200 includes eight types of work modes, the details of which are shown in table 1. The three bit signal Workmode_sig[3:1] can indicate the following eight types of work modes as shown in table 1.

TABLE 1

| WORK MODE (3 bits) | DESCRIPTIONS OF THE WORK MODE |
|---|---|
| 000 | Self-test mode |
| 001 | Ntree mode |
| 010 | Internal PLL clock work mode |
| 011 | Scan mode |
| 100 | Bist mode |
| 101 | External clock mode 2 |

TABLE 1-continued

| WORK MODE (3 bits) | DESCRIPTIONS OF THE WORK MODE |
|---|---|
| 110 | External clock mode 1 |
| 111 | External clock mode 0 |

The work mode signal Workmode_sig[3:1] can be input into at least one dispatcher. The dispatcher can determine the coming work mode of the chip based on three bit signal Workmode_sig[3:1] and output each functional signal to a corresponding function module based on the work mode of the chip. As shown in FIG. 11, the dispatcher 1 outputs a functional signal Function_sig[1] to at least one of function module 1 and function module 2 based on the determined work mode, and the dispatcher 2 outputs a functional signal Function_sig[2] to at least one of the function module 3 and function module 4 based on the determined work mode.

The disclosed embodiment is exemplary, and not meant to be limited as such. The function module 1 can be a Bist test module, the function module 2 can be a USB function module, the function module 3 can be a SPI function module, and the function module 4 can be a GPIO function module. The work mode signal Workmode_sig[3:1] can be input into a function module directly, for example, function module 5, where the function module 5 selects functions based on work mode indicated by the work mode signal Workmode_sig[3:1]. The function module 5 can be, but not limited to, a clock generation module.

When the GPS chip 1200 is powered on and the signal Reset_n is logic one, the HOST 1300 sends a high voltage through the pin GPIO[0], and then transmits multiple functional signals to the GPS chip 1200 through pins GPIO[1], GPIO[2] and GPIO[3]. As described above, the dispatchers send functional signals (for example, Function_sig[1] and Function_sig[2]) to different function modules. One of the functional signals (for example, Function_sig[3]) is input into the a function module (for example, function module 4 shown in FIG. 11) directly without a dispatcher.

The embodiment described in reference to and shown by FIG. 11 is set forth to provide a thorough understanding of the signal input circuit and a method. The signal input circuit and method can be used in other kinds of chips or circuits that need to share common signal input terminals, in accordance with the embodiments described herein. Furthermore, the embodiment described in FIG. 11 shows the corresponding pins and components for inputting work mode signals and functional signals by sharing the common signal input terminals, and other elements or components are not shown to avoid unnecessarily obscuring aspects of embodiments of the present disclosure. It should be understood by those skilled in the art that the signal input circuit and the chip are not limited to the components shown in FIG. 11 and that the number of the work mode signals may be the same or different as the number of the functional signals, in accordance with one embodiment of the present disclosure.

While the foregoing description and drawings represent embodiments of the present disclosure, it will be understood that various additions, modifications, and substitutions may be made therein without departing from the spirit and scope of the principles of the present disclosure as defined in the accompanying claims. One skilled in the art will appreciate that the present disclosure may be used with many modifications of form, structure, arrangement, proportions, materials, elements, and components and otherwise, used in the practice of the disclosure, which are particularly adapted to specific environments and operative requirements without departing from the principles of the present disclosure. The presently disclosed embodiments are therefore to be considered in all respects as illustrative and not restrictive, the scope of the present disclosure being indicated by the appended claims and their legal equivalents, and not limited to the foregoing description.

We claim:

1. A signal input circuit, comprising:
a control signal input terminal configured for receiving a control signal;
at least one common signal input terminal each configured for receiving a corresponding common signal;
at least one first signal output terminal each configured for outputting a corresponding first signal;
at least one first signal unit, wherein an input terminal of each of said at least one first signal unit is coupled to said at least one common signal input terminal, wherein an output terminal of each of said first signal unit is coupled to said at least one first signal output terminal, and wherein said first signal unit includes a latch unit configured for receiving said corresponding common signal and outputting said corresponding common signal as said corresponding first signal under control of said control signal;
at least one second signal output terminal each configured for outputting a corresponding second signal; and
at least one second signal unit each configured for receiving said corresponding common signal and outputting said corresponding common signal as said corresponding second signal under control of said control signal,
wherein an input terminal of said at least one second signal unit is coupled to said at least one common signal input terminal, wherein an output terminal of each of said at least one second signal unit is coupled to said at least one second signal terminal, and wherein each second signal unit is configured for receiving a corresponding common signal and outputting the corresponding common signal as a second signal based on the control signal,
wherein said second signal unit comprises a plurality of flip-flops coupled in series, wherein an input terminal of a first flip-flop of the plurality of flip-flops is used as an input terminal of said second signal unit, and wherein each input terminal of other flip-flops of the plurality of flip-flops is coupled to an output terminal of a left adjacent flip-flop, and wherein an output terminal of a right-most flip-flop is used as an output terminal of said second signal unit.

2. The signal input circuit of claim 1, wherein an enable terminal of said latch in said first signal unit and a control terminal of said second signal unit are coupled to said control signal input terminal.

3. The signal input circuit of claim 1, wherein a voltage level of an enable voltage for said latch unit is opposite to a voltage level for resetting or setting said flip-flop.

4. The signal input circuit of claim 1, wherein the signal input circuit further comprises:
an inverter configured for outputting said control signal to said latch unit in said first signal unit, reversing said control signal from said control signal input terminal, and outputting an reversed control signal to said second signal unit;
wherein an input of said inverter is coupled to said control signal input terminal and a latch enable terminal of said latch unit in said at least one first signal unit, and wherein an output terminal of said inverter is coupled to a reset terminal or a set terminal of each of said flip-flops in said second signal unit.

5. The signal input circuit of claim 1, wherein the signal input circuit further comprises:
an inverter configured for outputting said control signal to said second signal unit, reversing said control signal from said control signal input terminal, and outputting a reversed control signal to said latch unit in said first signal unit;
wherein an input of said inverter is coupled to said control signal input terminal and a reset terminal or a set terminal of each of said flip-flops in said second signal unit, and wherein an output terminal of said inverter is coupled to a latch enable terminal of said latch unit in said at least one first signal unit.

6. The signal input circuit of claim 1, wherein when said control signal is in a first voltage level, said latch unit in said at least one first signal unit is enabled to receive said corresponding common signal and output said corresponding common signal as said corresponding first signal and said second signal unit is reset or set; and
wherein when the control signal is in a second voltage level which is inverse to the first voltage level, said second signal unit receives said corresponding common signal and outputs said corresponding common signal, and said latch unit in said first signal units latches said corresponding common signal which is received previously.

7. The signal input circuit of claim 1, further comprising:
at least one third signal input terminal configured for receiving a corresponding third signal;
at least one third signal output terminal; and
at least one third signal unit each configured for receiving said corresponding third signal and outputs said corresponding third signal as said first signal through said at least one third signal output terminal, wherein an input terminal of said third signal unit is coupled to said at least one third signal input terminal, and wherein each output terminal of said at least one third signal unit is coupled to said third signal output terminal.

8. The signal input circuit of claim 7, wherein said third signal unit includes a latch unit.

9. The signal input circuit of claim 8, wherein a latch enable terminal of said latch unit in said third signal unit is coupled to said control signal input terminal,
wherein if said control signal is in a first voltage level, said latch unit in said third signal unit is enabled to receive said corresponding third signal and output said corresponding third signal as said first signal,
and wherein if said control signal is in a second voltage level which is inverse to said first voltage level, said latch unit in said third signal units latches said corresponding third signal which is received previously.

10. The signal input circuit of claim 7, wherein said third signal unit includes a plurality of flip-flops coupled in series, wherein an input terminal of a first latch unit is used as an input terminal of said third signal unit, wherein each input terminal of the other flip-flops is coupled to an output terminal of the left adjacent flip-flop, and wherein an output terminal of a right-most flip-flop is used as an output terminal of said third signal unit.

11. The signal input circuit of claim 10, further comprises:
an inverter configured for inversing said control signal from said control signal input terminal and outputting a reversed control signal to said third signal unit,
wherein an input terminal of said inverter is coupled to said control signal input terminal and an output terminal of said inverter is coupled to a reset terminal or set terminal of each of said flip-flops in said third signal unit,
wherein said third signal unit is reset or set when said control signal is in a first voltage level; and
wherein when said control signal is in a second voltage level which is inverse to said first voltage level, said third signal unit configured for receiving said corresponding third signal and outputting said corresponding third signal as said first signal.

12. The signal input circuit of claim 1, further comprises:
at least one fourth signal input terminal configured for receiving a corresponding fourth signal;
at least one fourth signal output terminal; and
at least one fourth signal unit configured for receiving said corresponding fourth signal and outputting said corresponding fourth signal as said second signal through said at least one fourth signal output terminal under control of said control signal;
wherein an input terminal of said at least one fourth signal unit is coupled to said at least one fourth signal input terminal, and wherein an output terminal of said at least one fourth signal unit is coupled to said at least one fourth output terminal.

13. The signal input circuit of claim 12, wherein said fourth signal unit comprises a plurality of flip-flops coupled in series, and wherein an input terminal of a first flip-flop is used as an input terminal of said fourth signal unit, each input terminal of other flip-flops of the plurality of flip-flops being coupled to an output terminal of a left adjacent flip-flop, and an output terminal of a right-most flip-flop is used as an output terminal of said fourth signal unit.

14. The signal input circuit of claim 13, further comprising:
an inverter configured for inverting said control signal from said control signal input terminal, and outputting a reversed control signal to said fourth signal unit,
wherein an input terminal of said inverter is coupled to said control signal input terminal and an output terminal of said inverter is coupled to a reset terminal or a set terminal of each of said flip-flops in said fourth signal units,
wherein when said control signal is in a first voltage level, said fourth signal unit is reset or set, and
wherein when said control signal is in a second voltage level which is inverse to the first voltage level, said fourth signal unit receives said corresponding fourth signal and outputs said corresponding fourth signal as said second signal.

15. The signal input circuit of claim 1, wherein said first signal comprises a work mode signal and said second signal comprises a functional signal.

16. The signal input circuit of claim 1, wherein said control signal is generated by a power supply of said signal input circuit or by an external device.

17. A method for inputting a plurality of signals, comprising:
inputting a control signal with a first voltage level to reset or set a second signal unit to enable a latch unit in a first signal unit to receive a common signal from a corresponding common signal input terminal and output said common signal as a first signal, wherein said latch unit and said second signal unit are coupled to said corresponding common signal input terminal; and
inputting said control signal with a second voltage level which is inverse to the first voltage level to latch said latch unit to a previously received corresponding common signal, and to enable said second signal unit to receive said corresponding common signal from said corresponding common signal input terminal and output said corresponding common signal as a second signal,
wherein said second signal unit comprises a plurality of flip-flops coupled in series, wherein an input terminal of a first flip-flop of the plurality of flip-flops is used as an input terminal of said second signal unit, and wherein each input terminal of other flip-flops of the plurality of flip-flops is coupled to an output terminal of a left adjacent flip-flop, and wherein an output terminal of a right-most flip-flop is used as an output terminal of said second signal unit.

18. The method of claim 17, wherein said first signal comprises a work mode signal, and wherein said second signal comprises a functional signal.

19. The method of claim 17, wherein said control signal is generated by a power supply of said signal input circuit or by an external device.

20. A chip, comprising:
a control signal pin configured for inputting a control signal;
at least one common signal pin each configured for inputting a corresponding common signal; and
a signal input circuit configured for receiving said control signal, receiving said corresponding common signal and outputting said corresponding common signal as at least one of a first signal and a second signal under control of said control signal,
wherein a control signal input terminal of said signal input circuit is coupled to said control signal pin, and wherein said at least one common signal pin is coupled to a corresponding common signal input terminal of said signal input circuit,
wherein said signal input circuit includes a first signal unit and a second signal unit, wherein said first signal unit and said second signal unit are coupled to said at least one common signal pin, and wherein said first signal unit includes a latch unit configured for receiving said corresponding common signal and outputting said corresponding common signal as said corresponding first signal under control of said control signal, and wherein said second signal unit is configured for receiving said corresponding common signal and outputting said corresponding common signal as said corresponding second signal under control of said control signal, wherein said second signal input circuit comprises a plurality of flip-flops coupled in series, wherein an input terminal of a first flip-flop of the plurality of flip-flops is used as an input terminal of said second signal unit, wherein each input terminal of other flip-flops of the plurality of flip-flops is coupled to an output terminal of a left adjacent flip-flop, and wherein an output terminal of a right-most flip-flop is used as an output terminal of said second signal unit.

* * * * *